(12) United States Patent
Fang et al.

(10) Patent No.: US 10,475,775 B2
(45) Date of Patent: Nov. 12, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Hsu-Nan Fang, Kaohsiung (TW); Chun-Jun Zhuang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/680,063

(22) Filed: Aug. 17, 2017

(65) Prior Publication Data

US 2018/0061815 A1    Mar. 1, 2018

Related U.S. Application Data

(60) Provisional application No. 62/382,032, filed on Aug. 31, 2016.

(51) Int. Cl.
*H01L 23/29*      (2006.01)
*H01L 25/16*      (2006.01)
(Continued)

(52) U.S. Cl.
CPC .............. *H01L 25/16* (2013.01); *H01L 21/56* (2013.01); *H01L 21/561* (2013.01); *H01L 21/568* (2013.01); *H01L 23/295* (2013.01); *H01L 23/3128* (2013.01); *H01L 23/3135* (2013.01); *H01L 23/5384* (2013.01); *H01L 23/5386* (2013.01); *H01L 24/04* (2013.01); *H01L 24/14* (2013.01); *H01L 24/19* (2013.01); *H01L 24/13* (2013.01); *H01L 24/16* (2013.01); *H01L 24/81* (2013.01); *H01L 24/97* (2013.01); *H01L 2224/02311* (2013.01); *H01L 2224/02373* (2013.01); *H01L 2224/02379* (2013.01); *H01L 2224/02381* (2013.01); *H01L 2224/0401* (2013.01); *H01L 2224/04105* (2013.01); *H01L 2224/12105* (2013.01); *H01L 2224/131* (2013.01); *H01L 2224/13083* (2013.01);
(Continued)

(58) Field of Classification Search
CPC .......... H01L 2224/97; H01L 2924/181; H01L 24/97; H01L 21/563; H01L 2924/19041; H01L 21/56; H01L 2924/18161; H01L 24/96; H01L 23/295
USPC .......................... 257/787, 790, 723, 724, 528
See application file for complete search history.

(56) References Cited

U.S. PATENT DOCUMENTS

| | | | | |
|---|---|---|---|---|
| 6,998,721 B2* | 2/2006 | Zhou | .................... | G06K 9/0002 257/679 |
| 7,109,576 B2* | 9/2006 | Bolken | ................ | H01L 21/565 257/685 |

(Continued)

*Primary Examiner* — S. V. Clark
(74) *Attorney, Agent, or Firm* — Foley & Lardner LLP; Cliff Z. Liu

(57) ABSTRACT

A semiconductor package device comprises a circuit layer, an electronic component disposed on the circuit layer, a package element and a first encapsulant. The package element is disposed on the circuit layer. The package element includes at least two electrical contacts electrically connected to the circuit layer. The first encapsulant is disposed on the circuit layer. The first encapsulant encapsulates the electronic component and the package element and exposes the electrical contacts of the package element.

18 Claims, 16 Drawing Sheets

(51) Int. Cl.
*H01L 21/56* (2006.01)
*H01L 23/31* (2006.01)
*H01L 23/538* (2006.01)
*H01L 23/00* (2006.01)

(52) U.S. Cl.
CPC .............. *H01L 2224/14181* (2013.01); *H01L 2224/16225* (2013.01); *H01L 2224/16245* (2013.01); *H01L 2224/24137* (2013.01); *H01L 2224/24195* (2013.01); *H01L 2224/81005* (2013.01); *H01L 2224/81192* (2013.01); *H01L 2224/97* (2013.01); *H01L 2924/15311* (2013.01); *H01L 2924/18161* (2013.01); *H01L 2924/18162* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | | | |
|---|---|---|---|---|
| 7,807,510 | B2 * | 10/2010 | Kobayashi | H01L 21/565 257/686 |
| 7,906,860 | B2 * | 3/2011 | Meyer | H01L 21/561 257/723 |
| 8,004,095 | B2 * | 8/2011 | Shim | H01L 21/568 257/774 |
| 9,601,403 | B2 * | 3/2017 | Chen | H01L 23/3128 |
| 2013/0300002 | A1 * | 11/2013 | Yokoyama | H01L 23/3135 257/787 |
| 2016/0343651 | A1 | 11/2016 | Rae et al. | |

* cited by examiner

SEMICONDUCTOR PACKAGE DEVICE AND METHOD OF MANUFACTURING THE SAME

CROSS-REFERENCE TO RELATED APPLICATION

This application claims the benefit of and priority to U.S. Provisional Application No. 62/382,032, filed Aug. 31, 2016, the content of which is incorporated herein by reference in its entirety.

BACKGROUND

1. Technical Field

The present disclosure relates generally to a semiconductor package device and a method of manufacturing the same. The present disclosure relates to a semiconductor package device including a fan-out structure and a method of manufacturing the same.

2. Description of the Related Art

A comparative fan-out technique may include a face-up technique or a face-down technique. In the face-up technique, multiple electronic components (including active components and passive components) are disposed on a carrier and electrical connection pads/terminals/contacts/electrodes are exposed. A redistribution layer (RDL) is formed on the electronic components and electrically connected to the exposed electrical connection pads/terminals/contacts/electrodes of the electronic components. However, due to a variation in thickness or height of the electronic components, the electrical connection pads/terminals/contacts/electrodes of the electronic components are not located at a substantially same elevation, which would adversely affect the formation of the RDL.

SUMMARY

In one aspect, according to some embodiments, a semiconductor package device comprises a circuit layer, an electronic component disposed on the circuit layer, a package element and a first encapsulant. The package element is disposed on the circuit layer. The package element includes at least two electrical contacts electrically connected to the circuit layer. The first encapsulant is disposed on the circuit layer. The first encapsulant encapsulates the electronic component and the package element and exposes the electrical contacts of the package element.

In another aspect, according to some embodiments, a semiconductor package device comprises a circuit layer, a first electronic component disposed on the circuit layer, a package element and a second encapsulant. The package element is disposed on the circuit layer. The package element includes a second electronic component and a first encapsulant encapsulating the second electronic component. The second encapsulant is disposed on the circuit layer and encapsulates the first electronic component and the package element. A filler of the first encapsulant adjacent to or substantially at a boundary between the first encapsulant and the second encapsulant has a planar surface. The boundary is substantially perpendicular to a surface of the circuit layer.

In yet another aspect, according to some embodiments, a method of manufacturing a semiconductor package device comprises (a) providing a first carrier; (b) placing an electronic component and a package element on the first carrier, the electronic component including an electrical contact and the package element including an electrode; (c) forming a first encapsulant to cover the electronic component and the package element and to expose the electrical contact and the electrode; and (d) forming a circuit layer on the first encapsulant and electrically connected to the electrical contact and the electrode.

BRIEF DESCRIPTION OF THE DRAWINGS

Aspects of the present disclosure are best understood from the following detailed description when read with the accompanying drawings. It is noted that various features may not be drawn to scale, and in the drawings the dimensions of the depicted features may be arbitrarily increased or reduced for clarity of discussion.

Common reference numerals are used throughout the drawings and the detailed description to indicate the same or similar elements. The present disclosure will be more readily understood from the following detailed description taken in conjunction with the accompanying drawings.

DETAILED DESCRIPTION

Figure 1A:
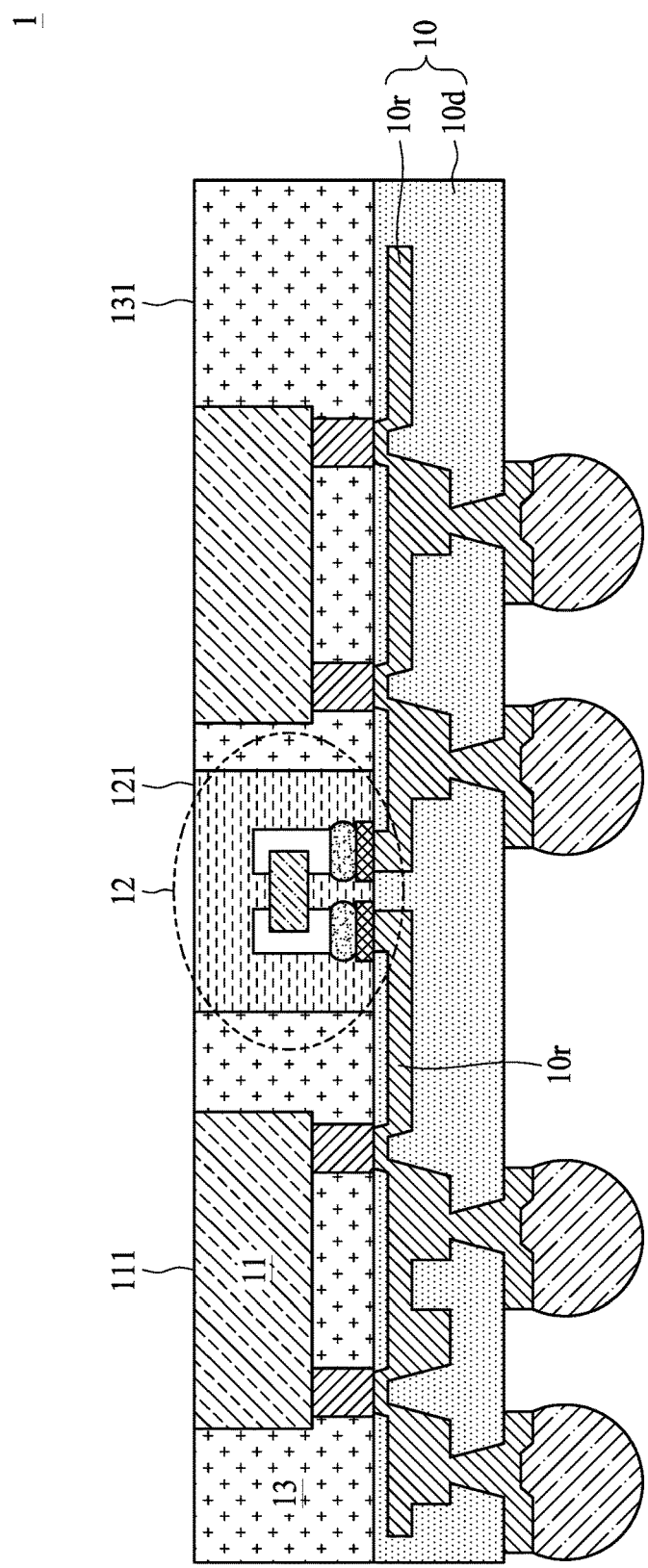
FIG. 1A illustrates a cross-sectional view of a semiconductor package device in accordance with some embodiments of the present disclosure.

FIG. 1A illustrates a cross-sectional view of some embodiments of a semiconductor package device 1 in accordance with a first aspect of the present disclosure. The semiconductor package device 1 includes a circuit layer 10, an electronic component 11, a package element 12 and a package body (or encapsulant) 13.

The circuit layer 10 includes an interconnection layer (e.g., redistribution layer, RDL) 10r and a dielectric layer 10d. A portion of the interconnection layer 10r is covered or encapsulated by the dielectric layer 10d while another portion of the interconnection layer 10r is exposed from the dielectric layer 10d to provide electrical connections for the electronic component 11 and the package element 12. In some embodiments, the dielectric layer 10d may include molding compounds, pre-impregnated composite fibers (e.g., pre-preg), Borophosphosilicate Glass (BPSG), silicon oxide, silicon nitride, silicon oxynitride, Undoped Silicate Glass (USG), any combination of two or more thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets. In some embodiments, there may be any number of interconnection layers 10r depending on design specifications. In some embodiments, a thickness of the circuit layer 10 is about 20 micrometer (μm).

The electronic component 11 is disposed on the circuit layer 10. The electronic component 11 may be an active component, such as an integrated circuit (IC) chip or a die. The electronic component 11 may be a passive component, such as a capacitor, a resistor or an inductor. The electronic component 11 may be electrically connected to one or more of another electronic component, the package element 12 and/or the circuit layer 10 (e.g., to the interconnection layer 10r exposed from the dielectric layer 10d), and electrical connection may be attained by way of flip-chip or wire-bond techniques.

The package element 12 is disposed on the circuit layer 10 and electrically connected to the portion of the interconnection layer 10r exposed from the dielectric layer 10d. In some embodiments, a top surface 121 of the package element 12 is substantially coplanar with a back surface (or back side) 111 of the electronic component 11.

Figure 1B:
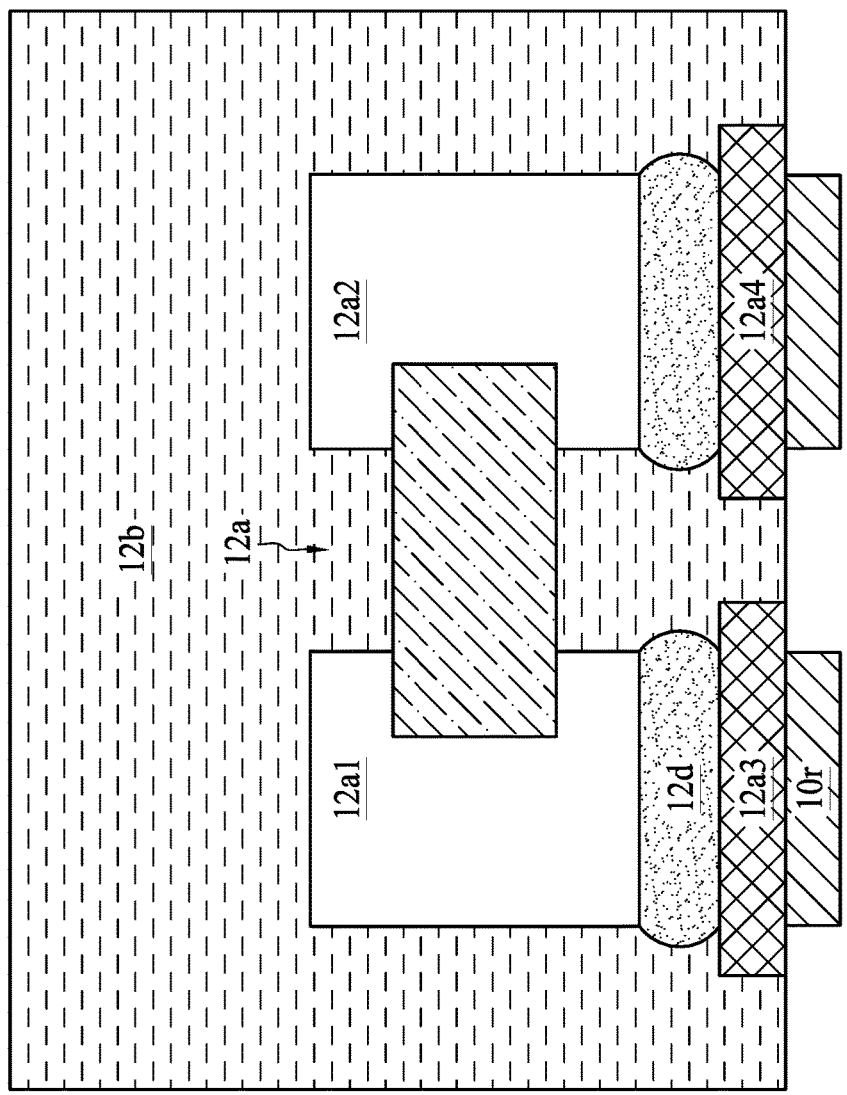
FIG. 1B illustrates a cross-sectional view of a package element in accordance with some embodiments of the present disclosure.

FIG. 1B illustrates a cross-sectional view of the package element 12 in accordance with some embodiments of the present disclosure. As shown in FIG. 1B, the package element 12 includes an electronic component 12a and a package body (or encapsulant) 12b covering or encapsulating the electronic component 12a.

The electronic component 12a may be a passive component, such as a capacitor, a resistor or an inductor. In some embodiments, the electronic component 12a is a two-port element including two electrodes 12a1 and 12a2. The electrodes 12a1 and 12a2 are arranged at a plane that is substantially parallel to a top surface of the circuit layer 10. In some embodiments, the electrical component 12a may be an active component, such as a transistor, an IC chip or a die that includes more than two electrodes. The electrodes 12a1 and 12a2 are respectively electrically connected to electrical contacts 12a3 and 12a4 through a solder layer 12d. The electrical contacts 12a3 and 12a4 are exposed from the package body 12b and electrically connected to the interconnection layer 10r (e.g., conductive pads) of the circuit layer 10. The electrical contacts 12a3 and 12a4 are arranged at a plane that is substantially parallel to the top surface of the circuit layer 10. In some embodiments, the electrical contacts 12a3 and 12a4 include copper, or another metal or metal alloy. In some embodiments, the package body 12b includes an epoxy resin including fillers, a molding compound (e.g., an epoxy molding compound or other molding compound), a polyimide, a phenolic compound or material, a material with a silicone dispersed therein, or a combination of two or more thereof.

Figure 1C:
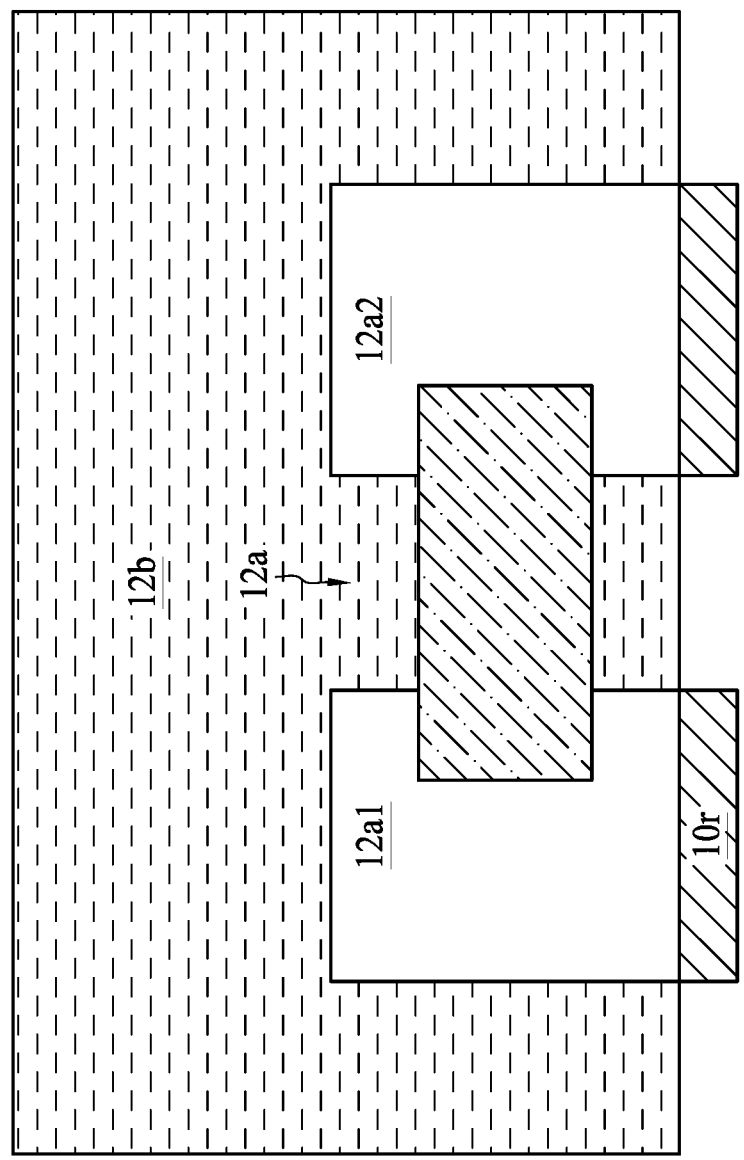
FIG. 1C illustrates a cross-sectional view of a package element in accordance with some embodiments of the present disclosure.

FIG. 1C illustrates a cross-sectional view of a package element 12' in accordance with some embodiments of the present disclosure. The package element 12' is similar to the package element 12 shown in FIG. 1B except that the package element 12' does not include the solder layer 12d and the electrical contacts 12a3, 12a4. For example, the electrodes 12a1 and 12a2 are exposed from the package body 12b and electrically connected to the interconnection layer 10r of the circuit layer 10. The electrodes 12a1 and 12a2 are arranged at a plane that is substantially parallel to the top surface of the circuit layer 10.

Figure 1D:
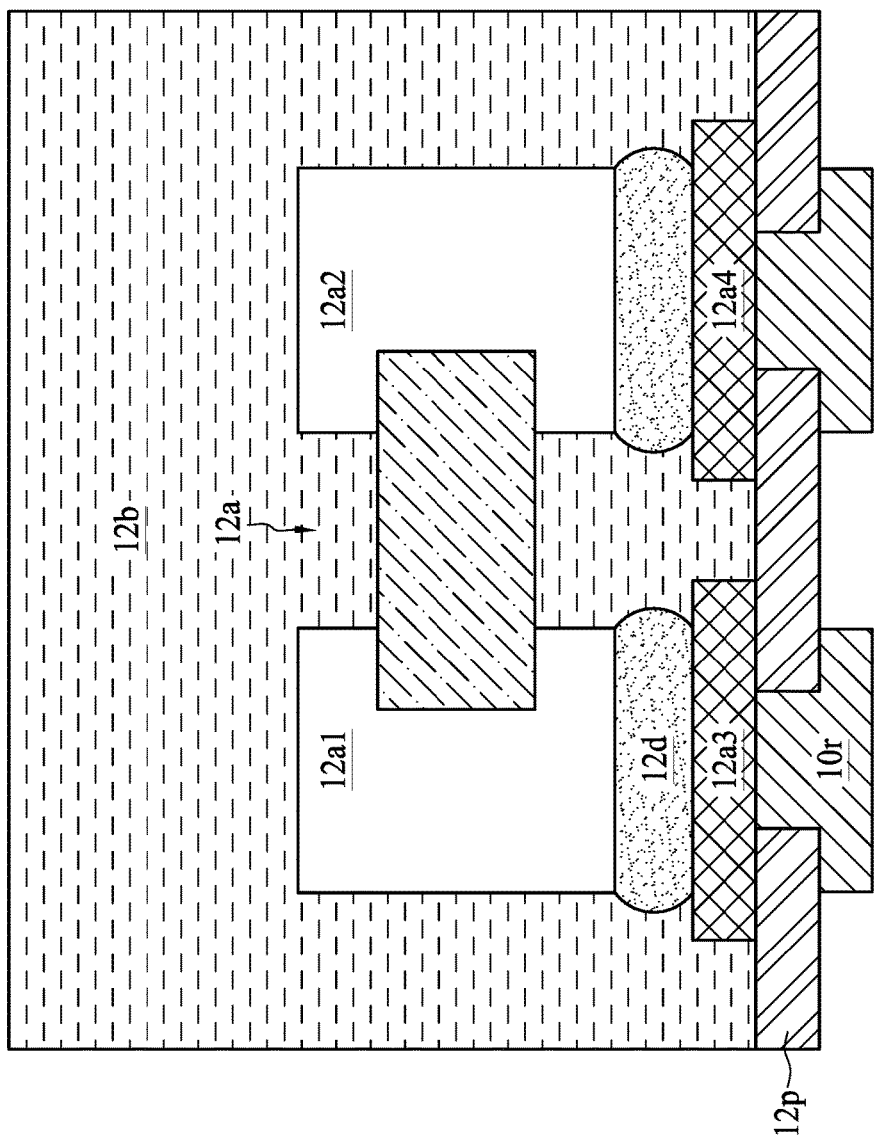
FIG. 1D illustrates a cross-sectional view of a package element in accordance with some embodiments of the present disclosure.

FIG. 1D illustrates a cross-sectional view of a package element 12" in accordance with some embodiments of the present disclosure. The package element 12" is similar to the package element 12 shown in FIG. 1B except that the package element 12" further includes a passivation layer 12p between the electrical contacts 12a3, 12a4 and the interconnection layer 10r of the circuit layer 10. In some embodiments, the passivation layer 12p includes silicon oxide, silicon nitride, gallium oxide, aluminum oxide, scandium oxide, zirconium oxide, lanthanum oxide, hafnium oxide, or another metal or non-metal oxide or nitride.

As shown in FIG. 1B, FIG. 1C and FIG. 1D, since a thickness of the electronic component 12a is less than a thickness of the electronic component 11, the package body 12b is used to cover or encapsulate the electronic component 12a, so that the total thickness of the package element 12, 12', or 12" is substantially the same as the thickness of the electronic component 11. For example, the top surface 121 of the package element 12 (see FIG. 1A) is substantially coplanar with (or aligned with) the back surface (or back side) 111 of the electronic component 11.

Referring to FIG. 1A, the package body 13 is disposed on the circuit layer 10 to cover or encapsulate the electronic component 11 and the package element 12. In some embodiments, the top surface 121 of the package element 12 and the back surface 111 of the electronic component 11 are exposed from the package body 13. In some embodiments, a top surface 131 of the package body 13 is substantially coplanar with the top surface 121 of the package element 12 and the back surface 111 of the electronic component 11. In some embodiments, the package body 13 includes an epoxy resin including fillers, a molding compound (e.g., an epoxy molding compound or other molding compound), a polyimide, a phenolic compound or material, a material with a silicone dispersed therein, or a combination of two or more thereof.

In some embodiments, the package body 13 and the package body 12b include the same material. Alternatively, the package body 13 and the package body 12b include different materials. In some embodiments, if the package body 12b and the package body 13 are formed of different materials, a warpage issue can be diminished. For example, the package body 12b may have a glass transition temperature (Tg) of about 120° C., a coefficient of thermal expansion (CTE) in a range from about 13 to about 58° $C.^{-1}$ and a flexural modulus of about 6 GPa, while the package body 13 may have a Tg of about 120° C., a CTE in a range from about 7 to about 2° $C.^{-1}$ and a flexural modulus of about 30 GPa.

Figure 1E:
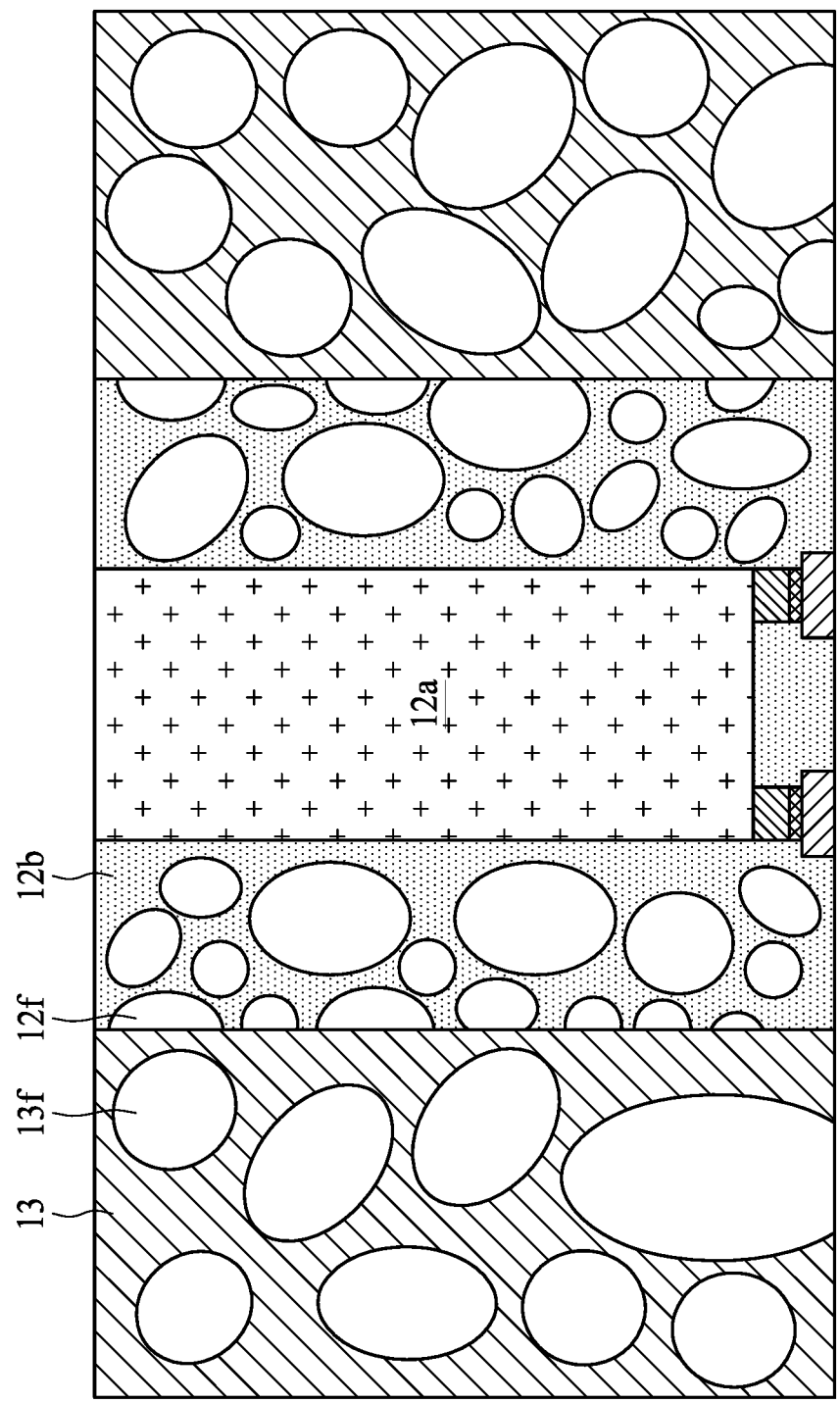
FIG. 1E illustrates an enlarged view of a package element in accordance with some embodiments of the present disclosure.

FIG. 1E is an enlarged view of a portion of the semiconductor package device 1, showing a boundary between the package element 12 and the package body 13, in accordance with some embodiments of the present disclosure.

The package body 13 includes a plurality of fillers 13f and the package body 12b includes a plurality of fillers 12f. As shown in FIG. 1E, since the package body 12b and the package body 13 are not formed in a single process, the fillers 13f and the fillers 12f are not continuous at the boundary between the package element 12 and the package body 13. A portion of the fillers 12f adjacent to or substantially at the boundary is cut through. In some embodiments, the boundary between the package element 12 and the package body 13 is substantially perpendicular to the top surface of the circuit layer 10.

FIG. 2A, FIG. 2B, FIG. 2C and FIG. 2D are cross-sectional views of a semiconductor structure at various stages of fabrication, in accordance with some embodiments of a method of manufacturing a semiconductor package device of the present disclosure. Various figures have been simplified to more clearly present aspects of the present disclosure.

Figure 2A:
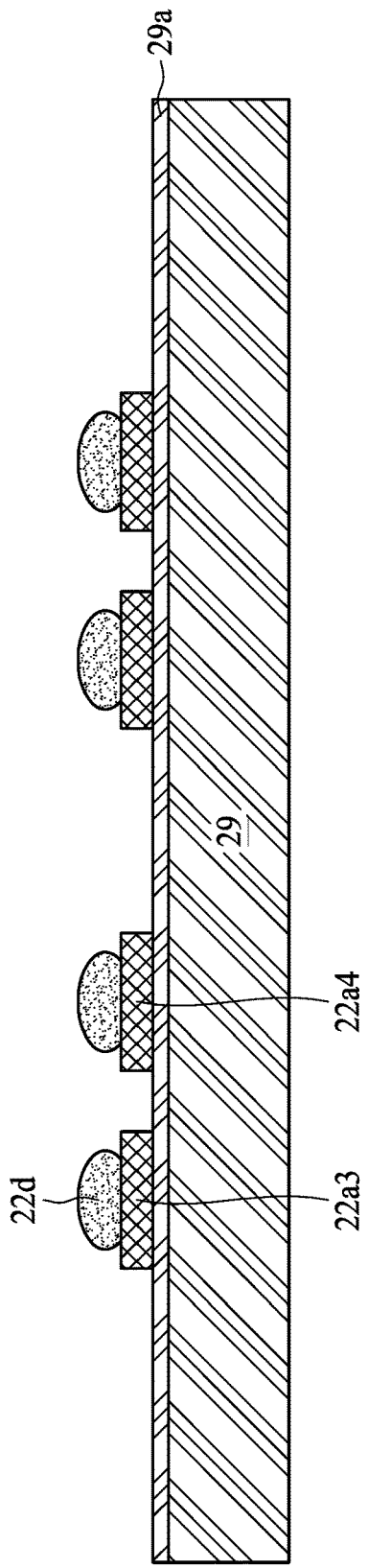
FIG. 2A, FIG. 2B, FIG. 2C and FIG. 2D illustrate a method of manufacturing a package element in accordance with some embodiments of the present disclosure.

Referring to FIG. 2A, a carrier 29 with an adhesive 29a (e.g., a tape) disposed thereon is provided. In some embodiments, the carrier 29 is a metal plate, a glass substrate or a silicon substrate. Multiple electrical contacts 22a3 and 22a4 are attached to the carrier 29 through the adhesive 29a, which can help to facilitate subsequent processes. A solder 22d is then disposed on the electrical contacts 22a3 and 22a4.

Figure 2B:
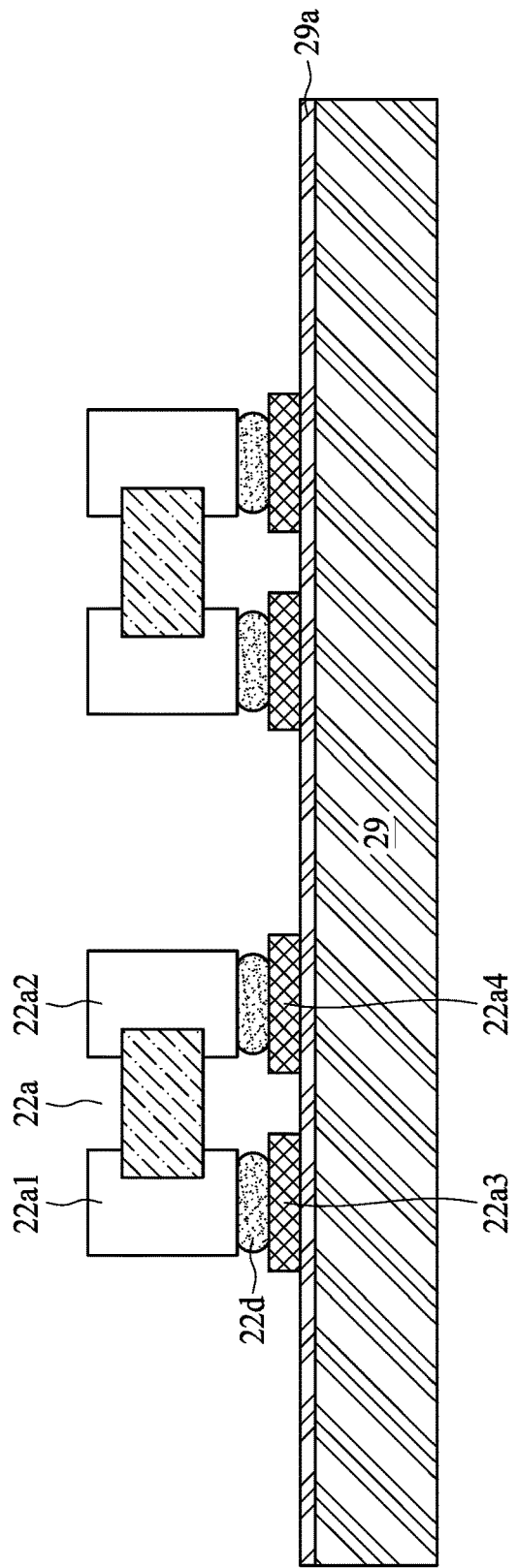

Referring to FIG. 2B, electronic components 22a are disposed on the electrical contacts 22a3, 22a4 and attached to the electrical contacts 22a3, 22a4 through the solder 22d. The electronic component 22a may be a passive component, such as a capacitor, a resistor or an inductor. In some embodiments, the electronic component 22a is a two-port element including two electrodes 22a1 and 22a2. In other embodiments, the electrical component 22a may be an active component, such as a transistor, an IC chip or a die that includes more than two electrodes.

Figure 2C:
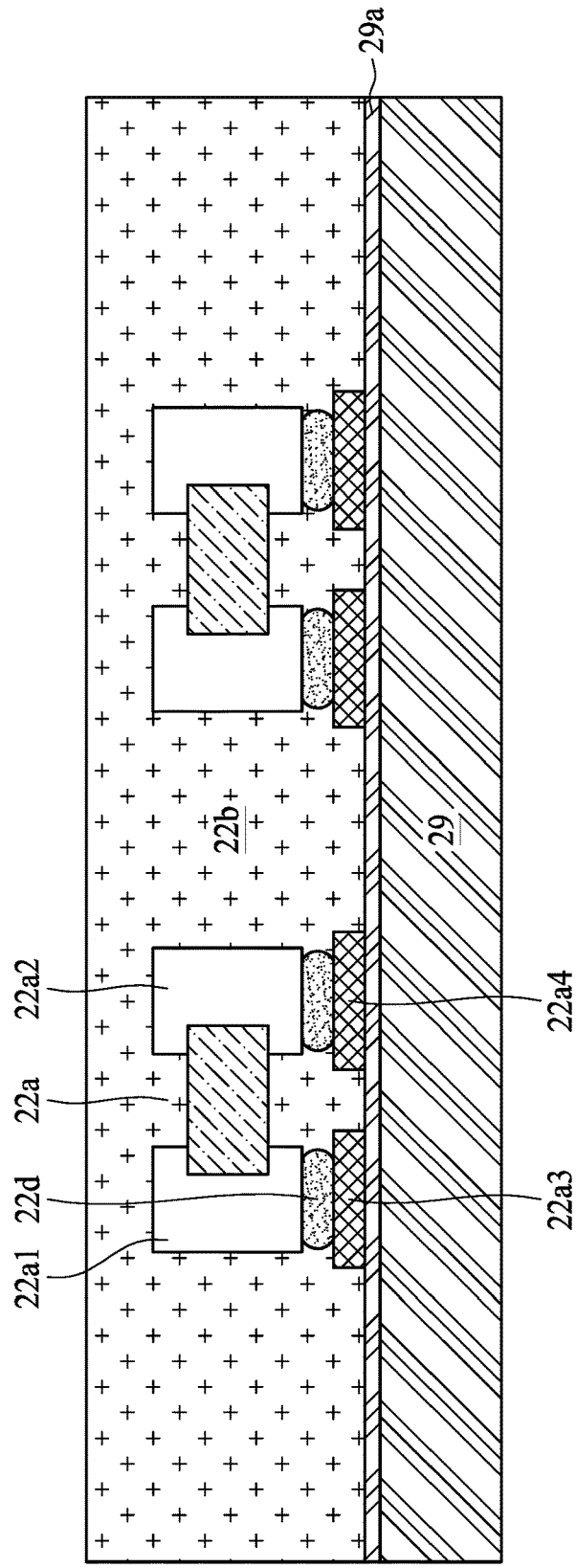

Referring to FIG. 2C, a package body (or encapsulant) 22b is formed on the carrier 29 to cover the electronic components 22a, the solders 22d and the electrical contacts 22a3, 22a4. In some embodiments, the package body 22b includes an epoxy resin including fillers, a molding compound (e.g., an epoxy molding compound or other molding compound), a polyimide, a phenolic compound or material, a material with a silicone dispersed therein, or a combination of two or more thereof. In some embodiments, the package body 22b may be formed by a molding technique, such as transfer molding or compression molding.

Figure 2D:
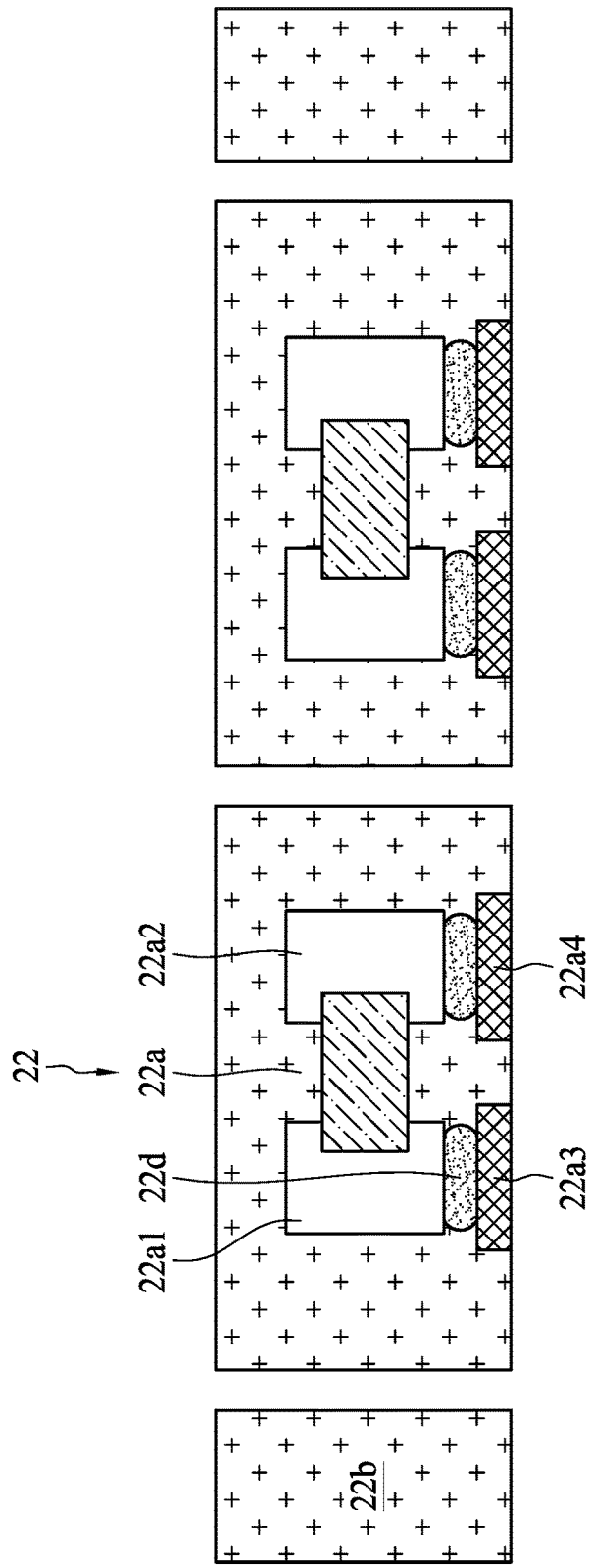

Referring to FIG. 2D, the carrier 29 and the adhesive 29a are removed from the package body 22b to expose the electrical contacts 22a3 and 22a4. Then, singulation may be performed to separate out individual package elements 22. That is, the singulation is performed through the package body 22b. The singulation may be performed, for example, by using a dicing saw, laser or other appropriate cutting technique. In some embodiments, the package element 22 is the same as, or similar to, the package element 12 shown in FIG. 1B.

Figure 3A:
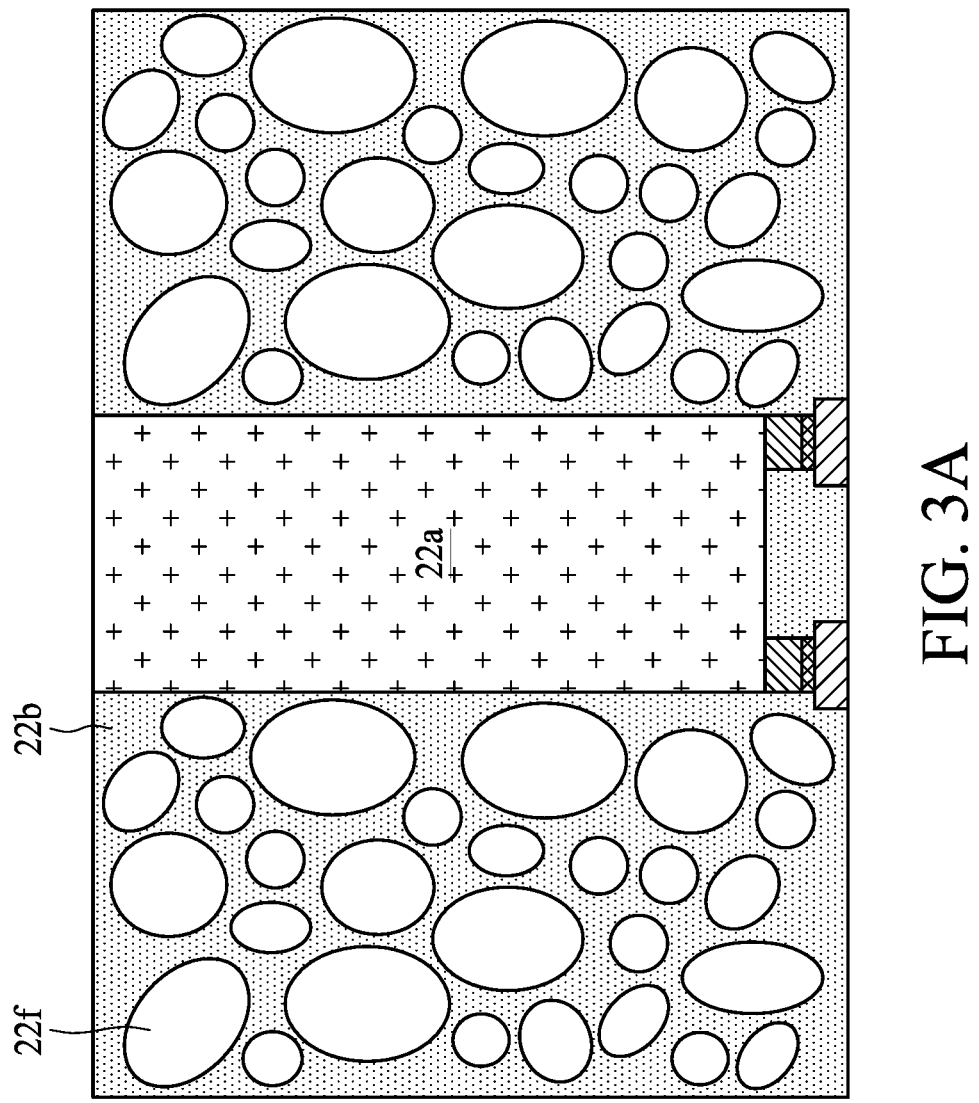
FIG. 3A and FIG. 3B illustrate an enlarged view of a package element in accordance with some embodiments of the present disclosure.
Figure 3B:
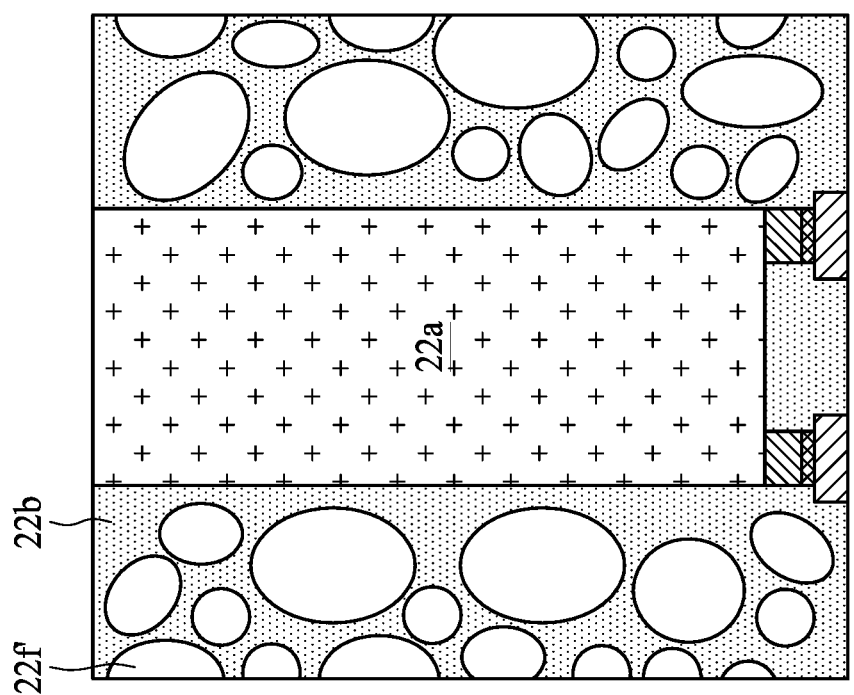

FIG. 3A illustrates fillers 22f in the package body 22b before singulation and FIG. 3B illustrates fillers 22f in the package body 22b after singulation, in accordance with some embodiments of the present disclosure. As shown in FIG. 3A and FIG. 3B, a portion of the fillers 22f' adjacent to a cutting line is cut through. For example, a cross-sectional surface of the fillers 22f' is planar or substantially planar, and is substantially coplanar with the cutting line.

FIG. 4A, FIG. 4B, FIG. 4C, FIG. 4D and FIG. 4E are cross-sectional views of a semiconductor structure at various stages of fabrication, in accordance with some embodiments of a method of manufacturing a semiconductor package device of the present disclosure. Various figures have been simplified to more clearly present aspects of the present disclosure.

Figure 4A:
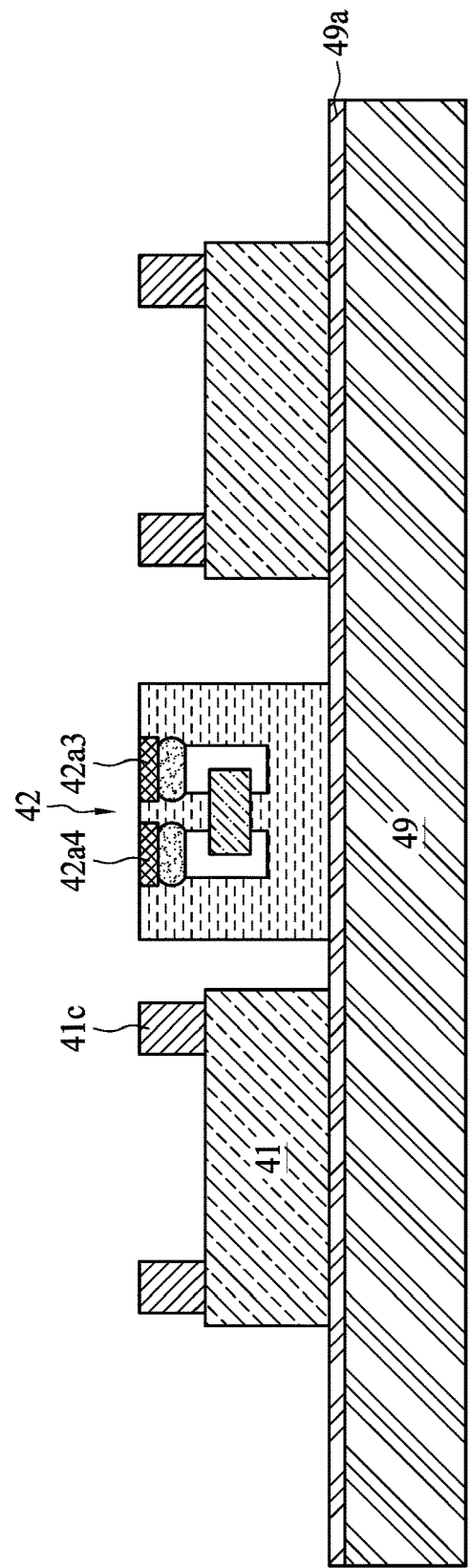
FIG. 4A, FIG. 4B, FIG. 4C, FIG. 4D and FIG. 4E illustrate a method of manufacturing a semiconductor package device in accordance with some embodiments of the present disclosure.

Referring to FIG. 4A, a carrier 49 with an adhesive 49a (e.g., a tape) disposed thereon is provided. In some embodiments, the carrier 49 is a metal plate, a glass substrate or a silicon substrate. Electronic components 41 and a package element 42 are attached to the carrier 49 through the adhesive 49a. At least one of the electrical components 41 may be an active component, such as an IC chip or a die. At least one of the electrical components 41 may be a passive component, such as a capacitor, a resistor or an inductor. In some embodiments, the package element 42 is the same as, or similar to, the package element 12 shown in FIG. 1B. Alternatively, the package element 42 can be the package element 12' or 12" shown in FIG. 1C or FIG. 1D. In some embodiments, electrical contacts 42a3 and 42a4 of the package element 42 is substantially coplanar with (or aligned with) electrical contacts 41c of the electronic components 41.

Figure 4B:
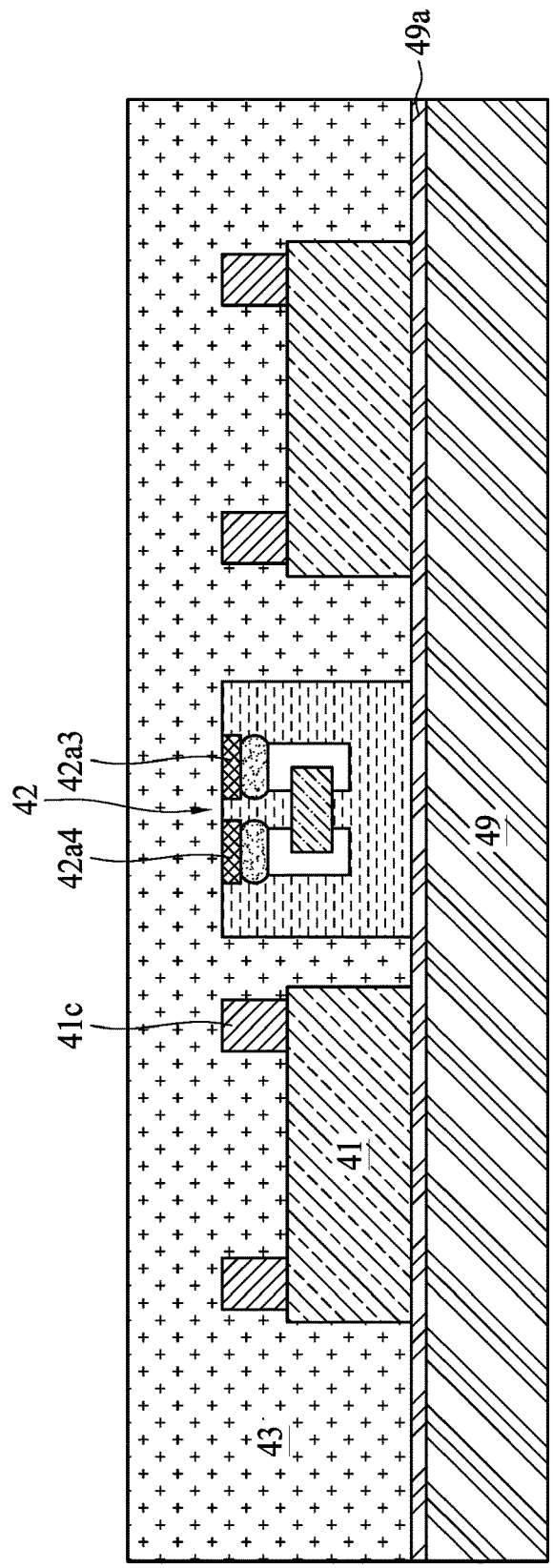

Referring to FIG. 4B, a package body (or encapsulant) 43 is formed on the carrier 49 to cover the electronic components 41 and the package element 42. In some embodiments, the package body 43 includes an epoxy resin including fillers, a molding compound (e.g., an epoxy molding compound or other molding compound), a polyimide, a phenolic compound or material, a material with a silicone dispersed therein, or a combination of two or more thereof. In some embodiments, the package body 43 may be formed by a molding technique, such as transfer molding or compression molding. In some embodiments, the package body 43 and a package body of the package element 42 include the same material. Alternatively, the package body 43 and the package body of the package element 42 include different materials.

Figure 4C:
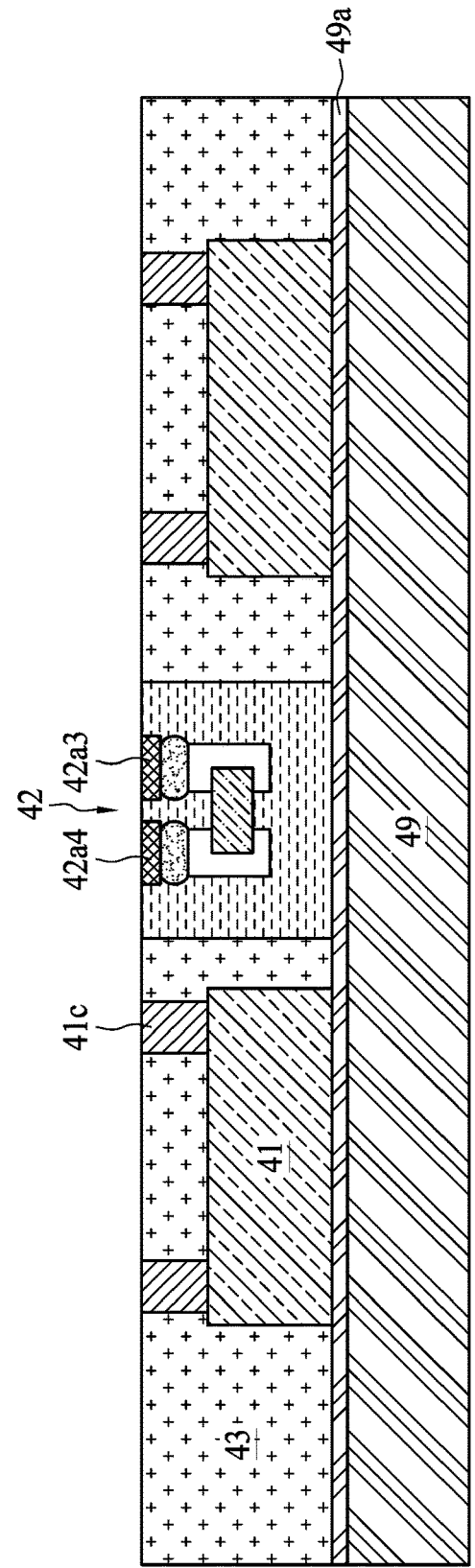

Referring to FIG. 4C, a portion of the package body 43 is removed to expose the electrical contacts 41c of the electronic components 41 and the electrical contacts 42a3 and 42a4 of the package element 42. In some embodiments, the portion of the package body 43 can be removed by grinding, etching or other suitable processes. In some embodiments, the electrical contacts 42a3 and 42a4 can be used as a buffer layer.

Figure 4D:
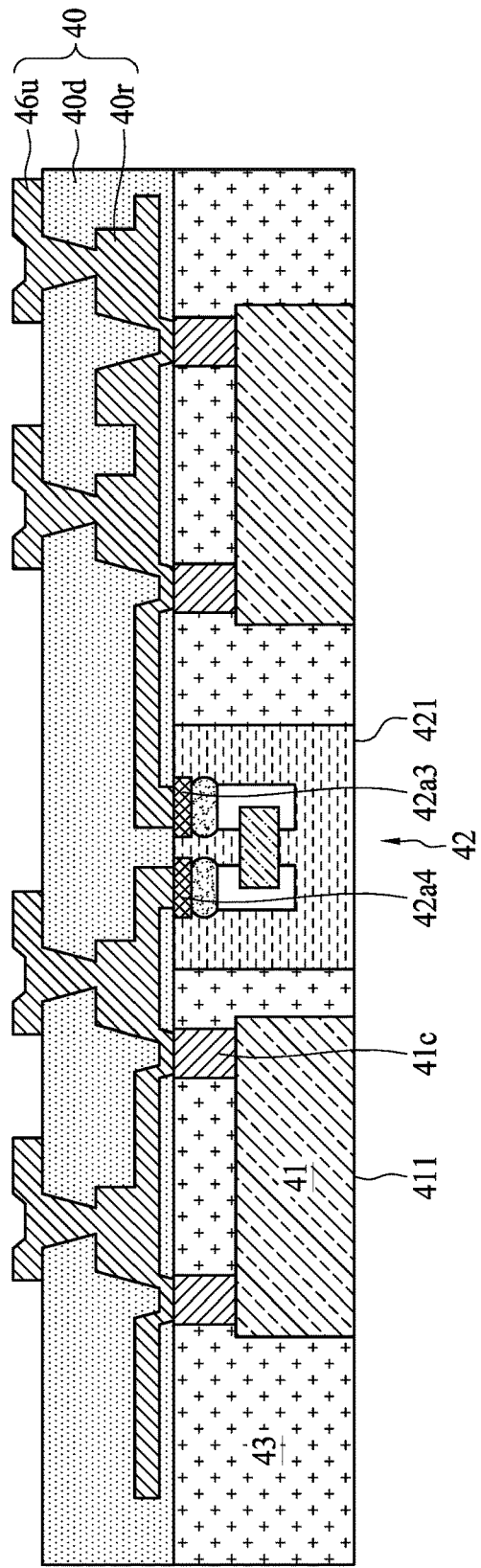

Referring to FIG. 4D, the carrier 49 and the adhesive 49a are removed from the package body 43 to expose a back surface 411 of each electronic component 41 and a surface 421 of the package element 42.

A circuit layer 40 is then formed on the package body 43 and electrically connected to the electrical contacts 41c of the electronic components 41 and the electrical contacts 42a3 and 42a4 of the package element 42. The circuit layer 10 includes one or more interconnection layers (e.g., RDL) 40r and one or more dielectric layers 40d covering or encapsulating the interconnection layers 40r. In some embodiments, there may be any number of interconnection layers 40r and dielectric layers 40d depending on design specifications. In some embodiments, the circuit layer 40 can be formed by the following operations: (i) forming a first dielectric layer on the package body 43; (ii) forming a plurality of openings in the first dielectric layer to expose the electrical contacts 41c of the electronic components 41 and the electrical contacts 42a3 and 42a4 of the package element 42; (iii) forming a first interconnection layer on the first dielectric layer and extending into the openings to electrically contact the conductive contacts 41c of the electronic components 41 and the electrical contacts 42a3 and 42a4 of the package element 42; (iv) forming a second dielectric layer on the first interconnection layer; (v) forming a plurality of openings in the second dielectric layer to expose a portion of the first interconnection layer; and (vi) forming a conductive layer 46u (e.g., an underbump metallization (UBM) layer) on the second dielectric layer and extending into the openings to electrically contact the exposed portion of the first interconnection layer.

Figure 4E:
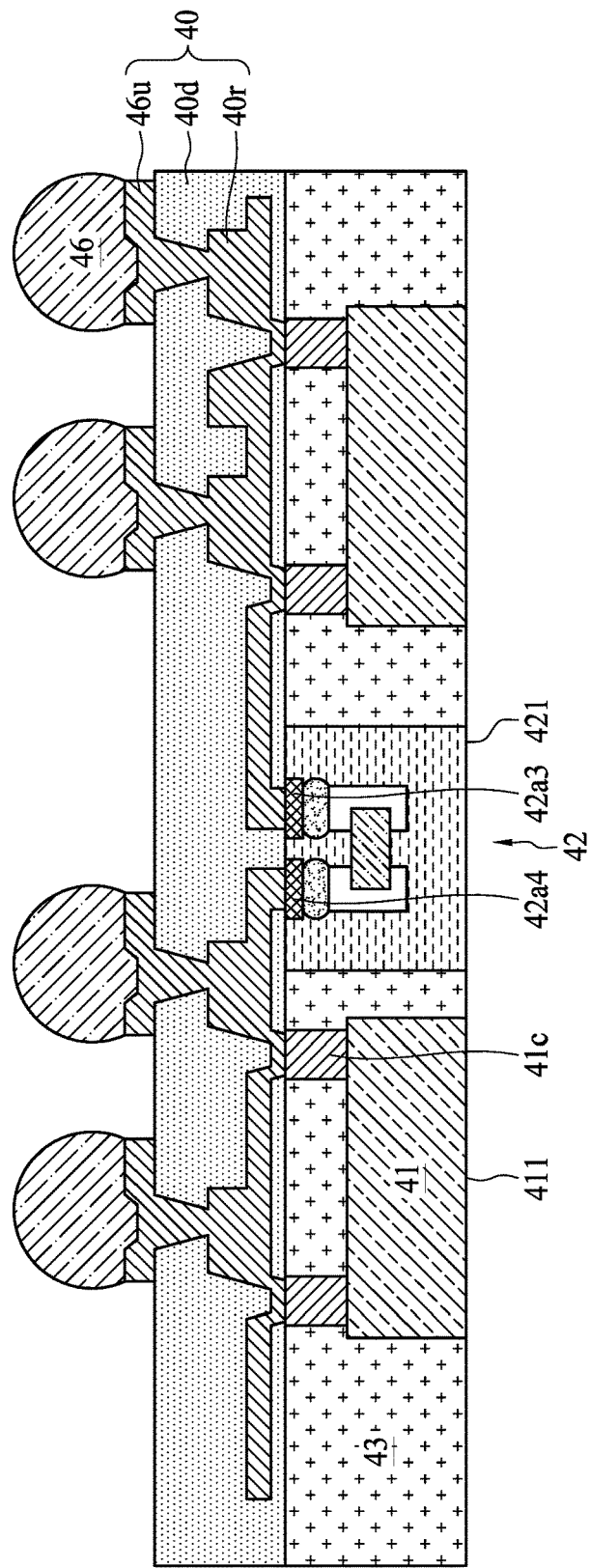

Referring to FIG. 4E, electrical contacts 46 (e.g., a controlled collapse chip connection (C4) pad) are formed or disposed on the conductive layer 46u to form the semiconductor package device 1 as shown in FIG. 1A. In some embodiments, a protection layer (not shown) may be formed on the back surfaces 411 of the electronic components 41 and the surface 421 of the package element 42.

As shown in FIG. 4A through FIG. 4D, the back surface 411 of the electronic component 41 is attached to the carrier 49, and the package body 43 is formed. After removing a portion of the package body 43 to expose the electrical contacts 41c of the electronic component 41 and the electrical contacts 42a3 and 42a4 of the package element 42, the circuit layer 40 is formed to be electrically connected to the electrical contacts 41c of the electronic component 41 and the electrical contacts 42a3 and 42a4 of the package element 42. This process is referred to as "face-up" process.

In some embodiments, an electronic component with a thickness less than the electronic component 41 may be directly disposed on the carrier 49. However, due to the different thickness or height of the electronic components, the electrical connection pads/terminals/contacts/electrodes of the electronic components are not located at a substantially same elevation. Therefore, after the operation to remove a portion of the package body 43 as shown in FIG. 4C, the electrical contacts 41c of the electronic component 41 with a greater thickness are exposed from the package body 43 while the electrical contacts of the electronic component with a lesser thickness remain covered by the package body 43. Therefore, during the operation to form the circuit layer 40 as shown in FIG. 4D, an interconnection layer or RDL of the circuit layer 40 is not connected to the electronic component with a lesser thickness, which would adversely affect the performance of the electronic components.

As shown in FIG. 4A, FIG. 4B, FIG. 4C, FIG. 4D and FIG. 4E of the present disclosure, since the electronic component with a lesser thickness is encapsulated by a package body to form a package element (e.g., the package element 42 or the package elements 12, 12' and 12" shown in FIG. 1B, FIG. 1C and FIG. 1D), the electrical contacts 42a3 and 42a4 are substantially coplanar with (or aligned with) the electrical contacts 41c of the electronic component 41. Since a reduced elevation of the relatively thinner electronic component is compensated by the package body, the circuit layer 40 can be formed so as to be electrically connected to both of the thinner electronic component and the thicker electronic component 41.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be planar or substantially planar if a difference between a highest point and a lowest point of the surface is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   a circuit layer;
   an electronic component disposed on the circuit layer;

a package element disposed on the circuit layer, the package element including at least two electrical contacts electrically connected to the circuit layer; and a first encapsulant disposed on the circuit layer, the first encapsulant encapsulating the electronic component and the package element and exposing the electrical contacts of the package element, wherein the package element includes a component and a second encapsulant, the component includes a passive component, and the electrical contacts are exposed from the second encapsulant, the second encapsulant includes a plurality of fillers, at least one of the fillers adjacent to a boundary between the first encapsulant and the second encapsulant has a planar surface, and the boundary is substantially perpendicular to a first surface of the circuit layer.

2. The semiconductor package device of claim 1, wherein the passive component includes two electrodes electrically connected to the electrical contacts; and the two electrodes are arranged at a plane, and the plane is substantially parallel to a second surface of the circuit layer.

3. The semiconductor package device of claim 2, wherein the package element includes a solder layer, and the electrodes are connected to the electrical contacts through the solder layer.

4. The semiconductor package device of claim 1, wherein the electrical contacts include two electrodes of the passive component.

5. The semiconductor package device of claim 1, wherein the first encapsulant and the second encapsulant include different materials.

6. The semiconductor package device of claim 1, wherein the first encapsulant has a surface facing the circuit layer; and the surface of the first encapsulant is substantially coplanar with exposed surfaces of the electrical contacts.

7. The semiconductor package device of claim 1, wherein the first encapsulant has a surface facing away from the circuit layer; and the surface of the first encapsulant is substantially coplanar with a back surface of the electronic component.

8. The semiconductor package device of claim 1, wherein the circuit layer includes a redistribution layer and a dielectric layer.

9. The semiconductor package device of claim 1, wherein the component includes an active component.

10. A semiconductor package device, comprising:
a circuit layer;
a first electronic component disposed on the circuit layer;
a package element disposed on the circuit layer, the package element including a second electronic component and a first encapsulant encapsulating the second electronic component; and
a second encapsulant disposed on the circuit layer and encapsulating the first electronic component and the package element, wherein the first encapsulant comprises a plurality of fillers, the second encapsulant comprises a plurality of fillers, at least one of the fillers of the first encapsulant is adjacent to a boundary between the first encapsulant and the second encapsulant and has a planar surface, the boundary is substantially perpendicular to a first surface of the circuit layer, and the fillers of the first encapsulant and the fillers of the second encapsulant are discontinuous at the boundary between the first encapsulant and the second encapsulant.

11. The semiconductor package device of claim 10, wherein
the second electronic component includes two electrodes exposed from the first encapsulant; and
the electrodes are arranged at a plane, and the plane is substantially parallel to a second surface of the circuit layer.

12. The semiconductor package device of claim 10, wherein
the package element includes electrical contacts and solders;
the second electronic component includes two electrodes connected to the electrical contacts through the solders;
the electrical contacts are exposed from the first encapsulant.

13. The semiconductor package device of claim 10, wherein the first encapsulant and the second encapsulant are formed of different materials.

14. The semiconductor package device of claim 10, wherein
the second encapsulant has a surface facing away from the circuit layer; and
the surface of the second encapsulant is substantially coplanar with a back surface of the first electronic component.

15. The semiconductor package device of claim 10, wherein the circuit layer comprises a redistribution layer and a dielectric layer.

16. The semiconductor package device of claim 1, wherein the first encapsulant has a surface facing away from the circuit layer, the second encapsulant has a surface facing away from the circuit layer, and the surface of the first encapsulant is substantially coplanar with the surface of the second encapsulant.

17. The semiconductor package device of claim 1, wherein the first encapsulant comprises a plurality of fillers, and the fillers of the first encapsulant and the fillers of the second encapsulant are discontinuous at the boundary between the first encapsulant and the second encapsulant.

18. The semiconductor package device of claim 10, wherein the first encapsulant has a surface facing away from the circuit layer, the second encapsulant has a surface facing away from the circuit layer, and the surface of the first encapsulant is substantially coplanar with the surface of the second encapsulant.

* * * * *